(12) United States Patent
Doudoumopoulos et al.

(10) Patent No.: US 7,964,453 B2
(45) Date of Patent: Jun. 21, 2011

(54) METHOD AND SYSTEM FOR SPATIALLY SELECTIVE CRYSTALLIZATION OF AMORPHOUS SILICON

(75) Inventors: Nicholas Doudoumopoulos, Garrett Park, MD (US); Paul Christensen, Tracys Landing, MD (US); Paul Wickboldt, Walnut Creek, CA (US)

(73) Assignee: Potomac Photonics, Inc., Lanham, MD (US)

( * ) Notice: Subject to any disclaimer, the term of this patent is extended or adjusted under 35 U.S.C. 154(b) by 0 days.

(21) Appl. No.: 12/453,571

(22) Filed: May 15, 2009

(65) Prior Publication Data
US 2010/0291760 A1 Nov. 18, 2010

(51) Int. Cl.
H01L 21/00 (2006.01)
H01L 21/84 (2006.01)
H01L 21/26 (2006.01)
H01L 21/42 (2006.01)
H01L 21/324 (2006.01)

(52) U.S. Cl. ......... 438/150; 438/149; 438/166; 438/795

(58) Field of Classification Search .................. 438/150, 438/166, 795, 660, 48, 66, 67, 73, 80, 149, 438/153
See application file for complete search history.

(56) References Cited

U.S. PATENT DOCUMENTS

| 5,413,958 | A | 5/1995 | Imahashi et al. |
| 6,008,101 | A | 12/1999 | Tanaka et al. |
| 6,322,625 | B2 | 11/2001 | Im |
| 6,979,605 | B2 | 12/2005 | Yamazaki et al. |
| 7,338,913 | B2 * | 3/2008 | Kasahara et al. ............. 438/795 |
| 7,709,378 | B2 * | 5/2010 | Im ................................. 438/660 |

OTHER PUBLICATIONS

G. Andra, et al. "Modeling the Preparation of PC-SI Thin Films with a CU Vapor Laser", Applied Physics, A67, pp. 513-516, 1998.
D. Good, "Novel Processes for Poly-Si Thin-Film Transistors on Plastic Substrates", Thesis, Electrical Engineering and Computer Sciences. University of California, Berkeley, Spring 2007.

* cited by examiner

Primary Examiner — Chuong A. Luu
(74) Attorney, Agent, or Firm — Rosenberg, Klein & Lee

(57) ABSTRACT

The manufacturing methodology to produce polycrystalline silicon in time and cost efficient manner uses a spatially selective crystallization approach to greatly reduce the amount of energy delivered to the work surface. The amorphous silicon film is subjected to laser radiation substantially exclusively at localized areas where TFTs are to be formed. The source of radiation is a copper vapor laser which produces a highly stable radiation in a visible spectrum with an energy sufficient to convert amorphous silicon into polysilicon in 1-3 shots. The optic system delivers the homogenized, conditioned and focused laser beam to the area of interest in a controlled manner. Single or multi-laser beam arrangements, as well as different shapes and sizes of laser beam spots are contemplated.

5 Claims, 8 Drawing Sheets

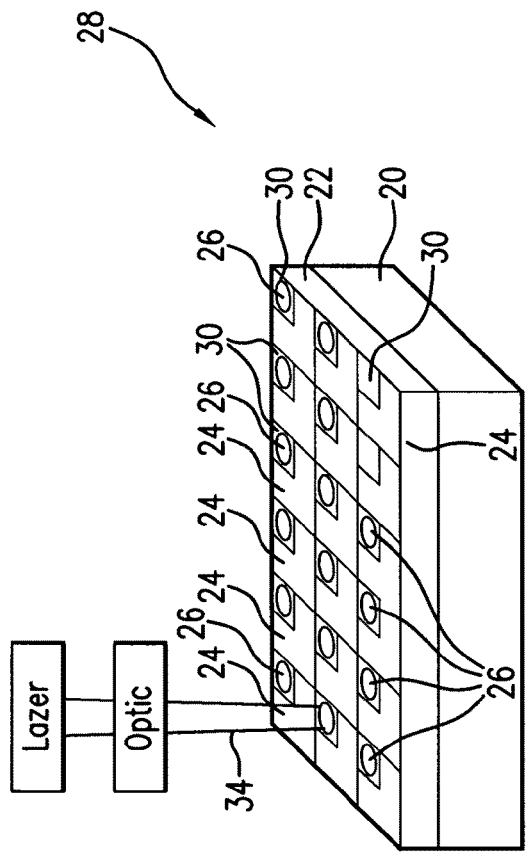
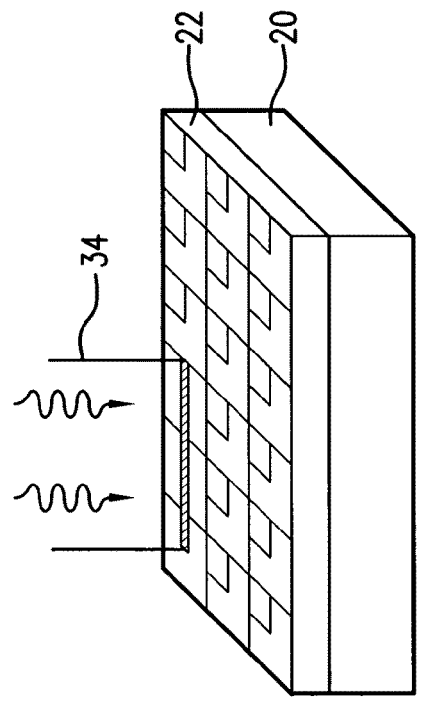
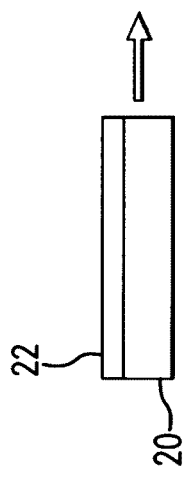
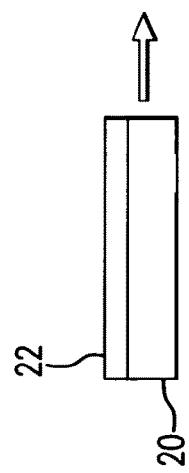
FIG.2A
FIG.2B

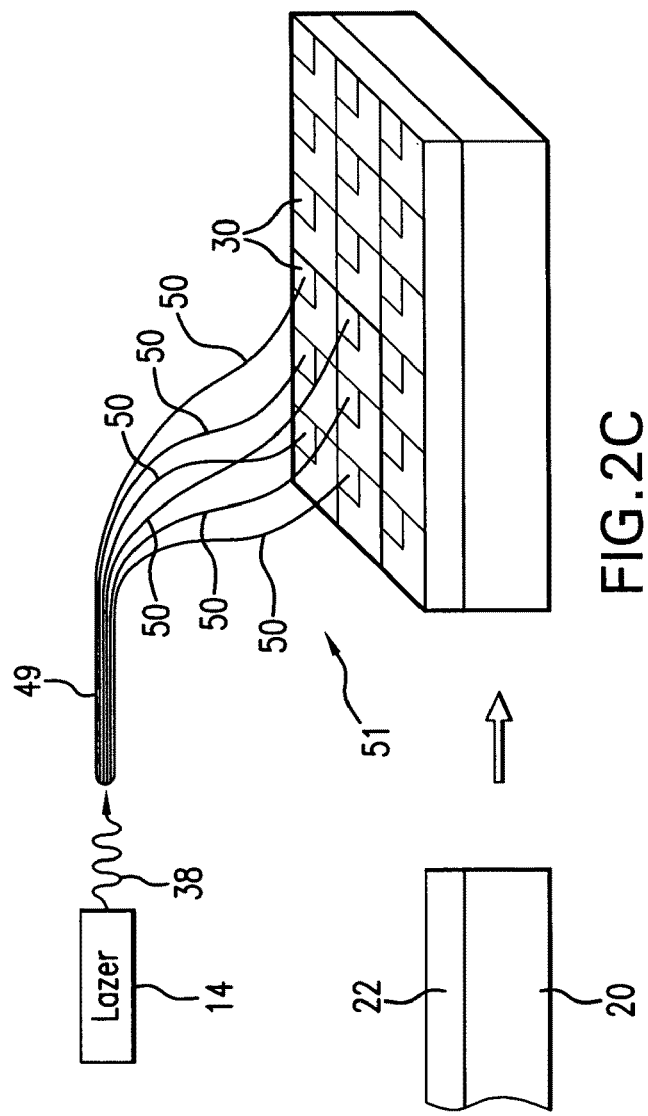
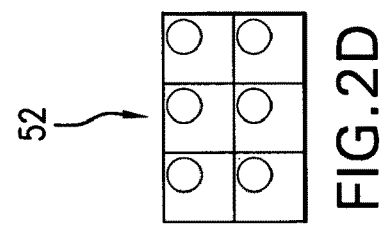
FIG. 2C
FIG. 2D

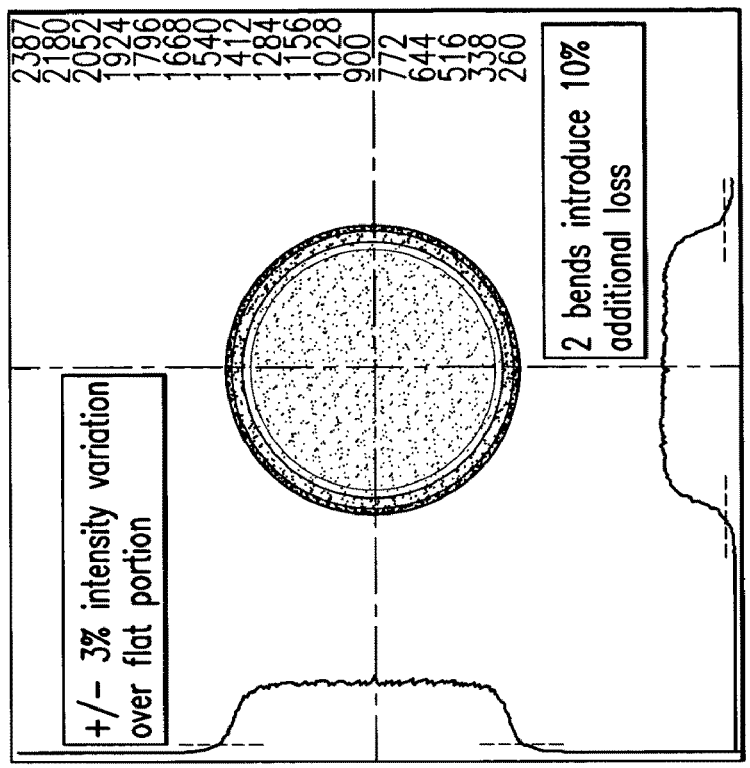
FIG.3B Post-Conditioned Beam Profile
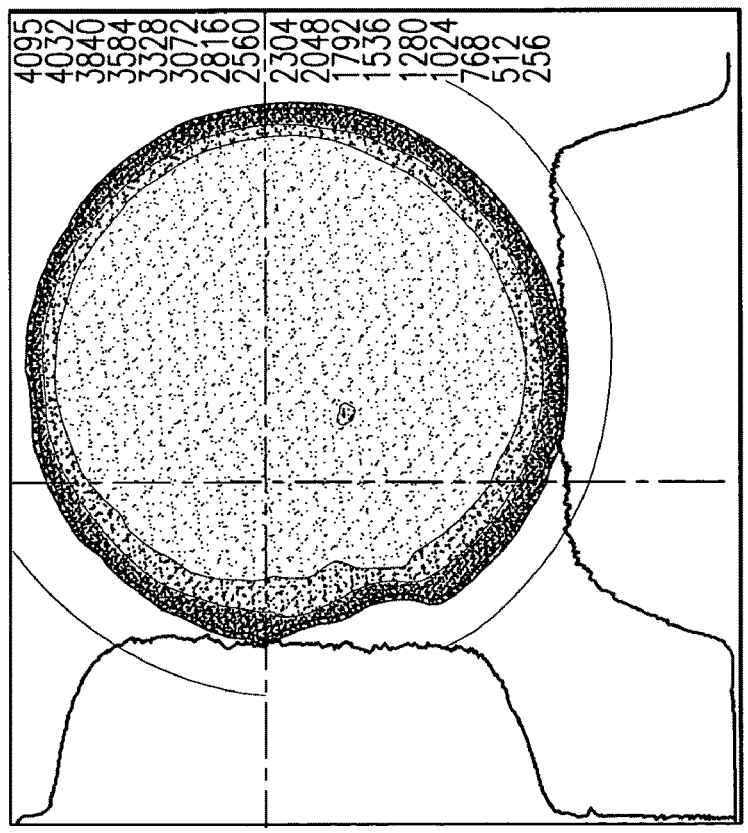
FIG.3A Raw Beam Profile

METHOD AND SYSTEM FOR SPATIALLY SELECTIVE CRYSTALLIZATION OF AMORPHOUS SILICON

FIELD OF THE INVENTION

The present invention relates to fabrication of semiconductor devices having arrays of Thin Film Transistors (TFTs), and specifically to production of polycrystalline silicon (poly-Si) serving as an active layer of TFTs.

In particular, the present invention is directed to spatially selective laser-assisted crystallization of amorphous silicon film to produce arrays of localized areas of polysilicon for manufacturing Thin Film Transistors thereat.

Even more in particular, the present invention is directed to manufacturing of Flat Panel Displays which operate with a plurality of Thin Film Transistors fabricated in poly-Si, where the poly-Si is produced by subjecting an amorphous silicon film to spatially selective crystallization by visible laser radiation generated by a copper vapor laser and delivered to predetermined localized areas on the amorphous silicon film where the Thin Film Transistors of the pixels are to be formed.

BACKGROUND OF THE INVENTION

Flat Panel Displays are becoming increasingly more popular for applications in cellular phones, PDAs, MP3 players, automobile navigation systems, computer monitors and television. The bulk Flat Panel Displays utilized in this and other applications are Liquid Crystal Displays. The mainstream back plane technology in these displays is based on amorphous silicon ($\alpha$-Si). However, for numerous advantageous reasons it is becoming more important to use polycrystalline silicon (poly-Si). The principle reasons for producing Liquid Crystal Displays using polycrystalline silicon is that Thin Film Transistors (TFTs) fabricated in polycrystalline silicon offer much better performance than TFTs fabricated in amorphous silicon. This higher performance lends itself to smaller transistors and larger aperture pixels for brighter displays, higher switching speeds beneficial in reduction of the image trail artifact associated with high speed motion in the picture, and higher current carrying capability. These attributes make possible efficient integration of the peripheral circuitry needed to drive the display electronics. As a result, the increased level and efficiency of integration lowers the manufacturing costs.

While several manufacturers already produce poly-Si displays, the current manufacturing tools mostly use "blanket" scanning in which a laser beam scans over entire surface of the amorphous silicon to uniformly crystallize amorphous silicon on the entire surface. Since Thin Film Transistors (the only devices benefiting from Si crystallization) occupy only few percent of the overall substrate area, the "blanket" approach is extremely inefficient. Due to the waste of energy and production time of unneeded high quality polysilicon, the "blanket" technique is translated into high unit costs and low throughput. Moreover, due to instability of the energy delivery to the amorphous Si surface, the "blanket" approach utilizes a high degree of shot-to-shot overlap (as high as 95%) to average out the laser beam variations which even further adds to excessive production costs.

In order to overcome the disadvantages of the "blanket" scanning for forming polycrystalline silicon layer on a substrate, the spatially selective crystallization approach has been developed which is disclosed for example in U.S. Pat. Nos. 6,979,605, 6,322,625, 6,008,101, and 5,413,958. In the disclosed systems, a laser energy is delivered selectively to predetermined regions where the TFTs are to be fabricated. In spatially selective crystallization only a fraction of the substrate is crystallized, thereby manufacturing the semiconductor devices at much lower cost than by the "blanket" crystallization technique.

A majority of the Si crystallization systems employ excimer lasers generating UV wavelengths radiation. However, the usage of excimer lasers for producing polycrystalline has several drawbacks:

(a) Instability of the excimer pulse energy which may be as high as ±6%. The laser annealing process is extremely sensitive to pulse energy stability, and therefore lasers with higher stability of the generated pulse energy are desired for manufacturing process.

(b) Another drawback of the excimer lasers is the complexity and cost of their maintenance. Excimer lasers generally require a chlorine or fluorine supply, which due to their high corrosiveness requires expensive plumbing maintenance as well as frequent fills of fresh gas due to decay of active gas species in the laser chamber during the laser operation.

Solid state lasers may be desirable for their reliability. However, solid-state lasers are usually unacceptable for the purposes of Si crystallization, since they have energy temporal non-uniformity in the range of ±6-7%.

Copper vapor laser for production of polycrystalline silicon was suggested in G. Andra, et al. "Modeling the Preparation of PC-SI Thin Films with a CU Vapor Laser", Applied Physics, A67, pp. 513-516, 1998. In experiments which were conducted, laser pulses of high repetition rate were scanned across the $\alpha$-Si film leading to highly overlapping laser spots in accordance with the "blanket" crystallization approach. By applying radiation of a copper vapor laser which emits pulses of several tenths of ns in duration comparable to that of an excimer laser, grain sizes of 450 nm have been obtained.

In contrast to the excimer laser, however, the emitted wavelength of the copper vapor laser in the visible region (511 nm and 578 nm) has a much longer absorption length in amorphous silicon, and therefore thicker films may be crystallized by copper vapor laser than by excimer laser. Additionally, a smaller energy per photon at the visible wavelength spectrum than in the UV range, enables preferential absorption by polycrystalline Si, thereby reducing heat build-up.

Despite the benefits of copper vapor laser induced Si crystallization, there has been no indication of the use of spatial selective crystallization. Therefore, it would be advantageous to apply the benefits of highly stable visible radiation produced by copper vapor laser to the principles of spatially selective approach for crystallization of amorphous silicon for production of arrays of Thin Film Transistors.

SUMMARY OF THE INVENTION

It is therefore an object of the subject method and system to provide spatially selective Si crystallization techniques in the fabrication of semiconductor devices having arrays of Thin Film Transistors by exposing localized areas of amorphous silicon film to visible radiation produced by copper vapor laser to obtain polysilicon in the areas where TFTs are to be produced, thereby attaining time and cost efficient manufacturing, as well as savings of laser energy.

It is another object of the present invention to use a copper vapor laser for spatial selective crystallization of amorphous silicon for production of high quality semiconductor devices due to high stability of the generated laser beam (in the range of ±1%).

The present method for crystallization of amorphous silicon is carried out by forming an amorphous silicon film on a planar surface of a substrate, and subjecting, in a predetermined sequential order, only predetermined localized areas on an amorphous silicon film to the pulsed visible laser radiation generated by a copper vapor laser, thereby converting the amorphous silicon film into polycrystalline silicon only in the predetermined localized areas irradiated by the visible laser beam.

In order to attain increased crystallization speed, the laser beam has to be of a predetermined level of the energy sufficient to crystallize α-Si during the predetermined laser pulse duration.

It is also important to homogenize and condition the visible laser radiation generated by the copper vapor laser prior to delivering the same to the localized areas so that the laser beam has a cross-section of a predetermined shape, dimensions, and uniformity across the entire laser beam spot. The visible laser radiation is focused by a focusing optics and the amorphous silicon film is placed in the focus of the laser beam for irradiation, which is important to the quality of the produced miniature structures.

The laser beam spot may be annularly or rectangularly contoured. The rectangularly contoured cross-section of the visible laser beam may have a width which is much smaller than dimensions of pixels, and a length expanded over two or more neighboring localized areas. In this manner when the pulsed laser radiation is delivered to the localized areas, a polysilicon strip is formed crossing two or more pixels.

Visible laser radiation may be delivered to the amorphous silicon layer through a single optical path or multiple optical paths. In the multiple beams arrangement, the radiation generated by the laser is divided into a plurality of the laser "beamlets" by a "bundle" of light tubes or optical fibers which receive the laser radiation at one end thereof, and produce an array of laser beam spots at another end. The multiple laser beam spots may be arranged in a predetermined array corresponding to at least a portion of the array of localized areas on the amorphous silicon film. An array of multiple spots, as well as a "strip" like spot covering the length of two or more pixels, may be scanned across the α-Si film by beam scanners such as, for example, 2-axis galvanometer. Alternatively, the substrate holder (stage) may be controllably translated in x-y-z directions to align the laser beam spot(s) with the predetermined α-Si locations, as well as to place the substrate surface into the laser beam focus. Delivery of the laser radiation to the amorphous silicon film either to create a strip of the polycrystalline silicon crossing several pixels or to form an array of crystallized Si areas in one "shot", requires less time to "cover" the localized areas across the entire α-Si film. The aforementioned approaches further contribute to reduced manufacturing time, costs, and the laser energy consumption.

An additional aspect of the present method pertains to the fabrication of a semiconductor device having an array of microstructures (TFTs), which is performed through the steps of:

forming an amorphous silicon film on a substrate surface, establishing localized areas corresponding to positions of the microstructures, operating a copper vapor laser for generation of visible light pulses at predetermined time instances, controllably coordinating actuation of the copper vapor laser with its disposition relative to the substrate, thereby subjecting in a predetermined sequential order, substantially exclusively the localized areas of the amorphous silicon film where the microstructures are to be formed to the visible light pulses of a predetermined energy level and duration sufficient to convert the amorphous silicon into polycrystalline silicon, and forming the microstructures in the polysilicon in said localized areas.

The amorphous silicon between the poly-Si localized areas is not exposed to the laser radiation, thereby saving a laser radiation energy and production time.

The present invention also represents a system for fabricating a semiconductor device including arrays of Thin Film Transistors which includes:

an amorphous silicon film formed on a substrate, a positioning stage with the substrate mounted and secured thereto, a copper vapor laser generating pulsed visible laser radiation, a data concerning a topology of the semiconductor device, a processor unit operatively coupled to the positioning stage and the copper vapor laser, and an optical unit coupled to the copper vapor laser to condition the pulsed visible laser radiation into a homogenized, shaped and focused visible laser beam and to deliver such to the localized areas in a predetermined sequential order, thereby crystallizing the amorphous silicon film sufficiently exclusively at the localized areas thereof.

The processor unit controls a relative disposition between the substrate and the pulsed visible laser radiation, and actuates the copper vapor laser at time instances coordinated with positions of localized areas on the amorphous silicon film corresponding to the TFTs to be further formed.

The copper vapor laser employed in the system is a rapid pulsed laser with the pulse repetition frequency in the range of up to 10 kHz and pulse duration not exceeding 200 ns, operating at wavelengths in the range of 500-600 nm, and having laser beam quality factor $M^2 > 15$.

It is important that the surface of the substrate is substantially a planar surface with flatness tolerance ranging ±30% of the Rayleigh range of the focused visible laser beam.

The optical unit may include a plurality of light pipes or optical fibers for dividing the generated visible laser radiation into a plurality of substantial identical laser beams arranged in a predetermined array of laser beam spots corresponding to at least a portion of the array of TFTs. A 2-axis galvanometer scanner may be employed for scanning the laser beam across the surface of the workpiece.

The homogenized and focused visible laser beam may have an annularly or rectangularly contoured laser beam spot. If the laser beam spot is a rectangularly contoured spot, the length may expand over at least two or more neighboring localized areas.

These and other features and advantages of the present invention will become clear in view of further description accompanying the Patent Drawings.

BRIEF DESCRIPTION OF THE DRAWINGS

FIGS. 2A-2D represent schematically alternative embodiments of the radiation delivery to the array of localized areas to be crystallized for production of TFTs;

FIGS. 3A and 3B show respectively the profile of the beam cross-section prior to conditioning (FIG. 3A) and post conditioned (FIG. 3B);

DETAILED DESCRIPTION OF THE PREFERRED EMBODIMENTS

Figure 1:
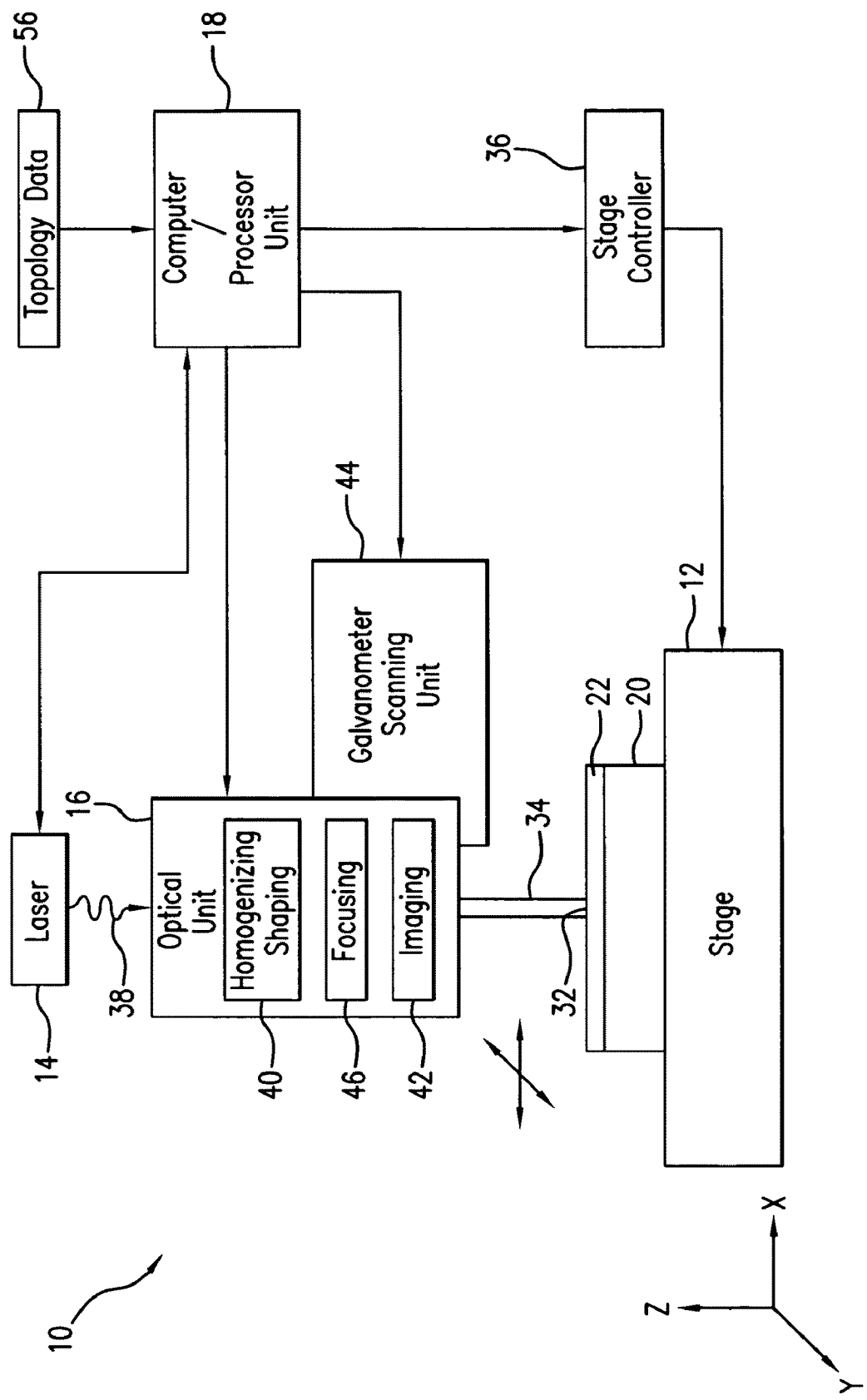
FIG. 1 is a schematic representation of the system for spatially selective crystallization of the present invention.

Referring to FIG. 1, there is shown a system 10 for producing an array of polycrystallized silicon areas includes a stage 12 capable of translation in the x-y-z directions, a source of radiation, e.g. a copper vapor laser 14, an optical unit 16 for the laser beam conditioning, homogenizing, shaping, focusing, and scanning, and a computer, e.g., the processor unit 18 controlling the operation of the entire system 10. The present system may be used for fabrication of semiconductor devices for different applications as long as polycrystalline silicon is needed for the operation of such a semiconductor device.

A substrate 20 of an insulative material such as, for example, glass, plastic, etc., covered with an amorphous silicon film 22, is mounted on the holder chuck (not shown) of the stage 12, and is secured thereto by one of numerous mechanisms known in the industry which may include, for example, vacuum, electrostatic and/or mechanic holders which operate to prevent unwanted displacement of the substrate during the scanning procedure.

Although the system 10 of the present invention may be used for production of poly-Si for a broad range of devices, the following description is presented with respect to manufacturing of Flat Panel Displays for the purposes of illustration. For example, a liquid crystal display 28 having a plurality of pixels 24 is shown in FIGS. 2A-2C is provided. Each pixel contains a Thin Film Transistor 26 schematically shown in FIG. 2A. The Liquid Crystal Display 28 is created in the system of the present invention through the spatially selective crystallization of the amorphous silicon film 22 in predetermined localized areas 30 corresponding to locations of Thin Film Transistors 26 in the pixels 24, as will be disclosed in detail in following paragraphs.

Referring to FIGS. 1 and 2A-2C, the areas 30 of the α-Si film 22 are subjected to the laser radiation pulses of a predetermined energy and duration sufficient to convert α-Si into poly-Si in a predetermined sequential order. The control of the relative disposition between the spot 32 of the laser beam 34 and the amorphous silicon film 22 may be accomplished in either of the following ways:

(a) the position of the spot 32 of the pulse laser beam 34 with respect to the amorphous silicon film 22 may be controlled by driving the stage 12 in three directions (x-y-z) with the stage controller 36 controlled by the processor unit 18 while the laser beam 34 is fixed, or (b) the irradiation position of the laser beam spot 32 may be controlled by the optical system 16 while the substrate position is fixed. Alternatively, the present system may employ both approaches (a) and (b) in combination.

Irrespective of which scanning method is used to establish relative disposition between the laser beam spot 32 and the amorphous silicon film 22, they all involve a displacement of the laser light spot with respect to the substrate with this process further referred to herein as scanning of the laser beam spot.

The laser 14 used in the system 10 of the present invention is a rapid pulsed copper vapor laser generating light at wavelengths between 500 nm and 600 nm with pulse repetition frequency up to 10 kHz and with pulse duration not exceeding 200 ns. The copper vapor laser 14 generates energy in the green and yellow regions of spectrum with approximately 60-70% of the energy at 574 nm and about 30-40% of the energy at 511 nm. The entire generated energy spectrum is consumed in the present system. The visible laser wavelengths utilized in the present system are preferentially absorbed by the amorphous silicon (rather than UV radiation employed in the conventional silicon crystallizing systems). Furthermore, the temporal and spatial uniformity of the laser beam allows 10-20× fewer laser pulses to be used for thermal conversion of the amorphous silicon into polycrystalline silicon than in UV excimer laser systems.

Copper vapor lasers use a tube filled with an inert carrier gas, typically neon, and a solid source of copper which is heated and vaporizes to provide the copper active species as a lasing medium. Partial pressure of active species is determined by the vapor pressure of copper at the heater temperature, typically around 1500° C. Concentration of species in the chamber can be maintained by keeping the heater temperature substantially constant. The only gas which is needed to be supplied to the tool is an inert carrier gas. The copper source only needs to be changed when the entire solid source has been vaporized, thereby making the maintenance of the copper vapor lasers convenient and simple.

Several known techniques are used to generate a consistent and stable electron density in the copper vapor laser tube during operation. By utilizing these techniques the copper vapor lasers produce pulse energy with low instability (as low as ±1%) thereby contributing to a high performance laser annealing process with a sufficient device-to-device uniformity and thereby permitting to obviate the need for pulse averaging required in excimer based systems. As an additional beneficial characteristic, the copper vapor lasers produce highly energetic laser radiation (50-5000 kW).

The absorption coefficient of amorphous silicon in the range of radiation (500-600 nm) is approximately $1 \times 10.5$ $cm^{-1}$ that leads to a penetration depth of 100 nm. This penetration depth is twice the typical TFT film thickness of 50 nm, thus approximately half of the laser energy is absorbed into the silicon film, while the other half passes through to the substrate. Typical low-cost substrate materials (such as glass or transparent plastic) are transparent to visible wavelength, so the damage from the transmitted laser light in the present system is not a concern.

The generated laser beam 38 exiting the laser 14 has a "top hat" profile, e.g., it is flat on top and has sharp edges. The laser beam is conditioned in the optical system 16 in order to provide a controlled amount of energy incident on a specific region 30 of each display pixel 24 on the substrate 20 where a TFT 26 is to be fabricated. For conditioning the highly incoherent beam (with the beam quality factor $M^2 > 15$), the laser beam 38 is passed through the optical unit 16 which includes homogenization optics 40 such as, for example, a glass rod homogenizer which functions to spatially overlap and average the various laser modes of the beam 32 thus producing a spatially uniform laser beam.

The homogenized laser beam is then focused onto the substrate using appropriate imaging optics 42 for scanning the laser beam over the substrate, as well as to position the planar surface of the substrate in the focus of the laser beam. A 2-axis galvanometer 44 may be used as a part of the optical system 16 to rapidly and precisely position the laser beam focus onto the workpiece. The galvanometer 44 deflects the laser beam 34 in a controlled manner in two dimensions via a pair of rotatable mirrors (not shown). The laser beam spot 32 in this arrangement may be positioned with the pinpoint accuracy and specified patterns may be traversed by the beam at defined speeds.

The galvanometer scanning unit 44 includes a scan head which receives the shaped and homogenized laser beam, focuses the beam, and scans it over the substrate. The scan head focuses the laser beam by using several stages such as pre-focusing lens, f-theta objective, dynamic pre-focusing and combining technique for dynamic pre-focusing with an f-theta objective.

The f-theta objectives are available for a wide variety of wavelengths and focal lengths, and therefore the galvanometer scanning unit is easily adaptable to the spectrum of radiation produced by the copper vapor laser 14. It is preferred that the present system uses a telecentric f-theta objective available for micromaterials processing which focuses the laser beam perpendicularly to the image field with a side length up to 50 nm.

The present system may use special scan heads available with precision optimized dynamics and actively cooled motors and/or electronics to minimize long-term drift. Scan heads from 14 mm aperture may be equipped with supplementary high precision position detectors for automatic self-calibration. In addition to x-y replacement of the laser beam spot, the galvanometer scanning unit may be capable of the repositioning of the focus along the z axis provided by "varioScan" unit available from Scan Lab, Germany.

In beam homogenizing and shaping unit 40, the uniform energy distribution of the produced laser beam may be attained in the illuminated field ("flat-top" or "top-hat"). Refractive beam homogenizers are appropriate for incoherent radiation produced by the copper vapor laser 14 regardless of the wavelength of the radiation. The homogenizer and shaper may include standard or customized microlens arrays.

The optical system 16 projects a beam spot of the laser radiation oscillating from the laser 14 on the amorphous silicon film. A glass rod of different cross-sections may be used for shaping the beam in the homogenizer. The glass rod used in homogenizing optics overlaps and averages the spatial modes of the emitted laser beam to result in a spatially uniform beam having a substantially smaller beam quality factor and concentrating more of the laser energy into lower order spatial modes. A shape of the laser light spot may be circular when the rod shape is cylindrical, or may be rectangularly contoured when the rod shape is a slab like contour.

Figure 4:
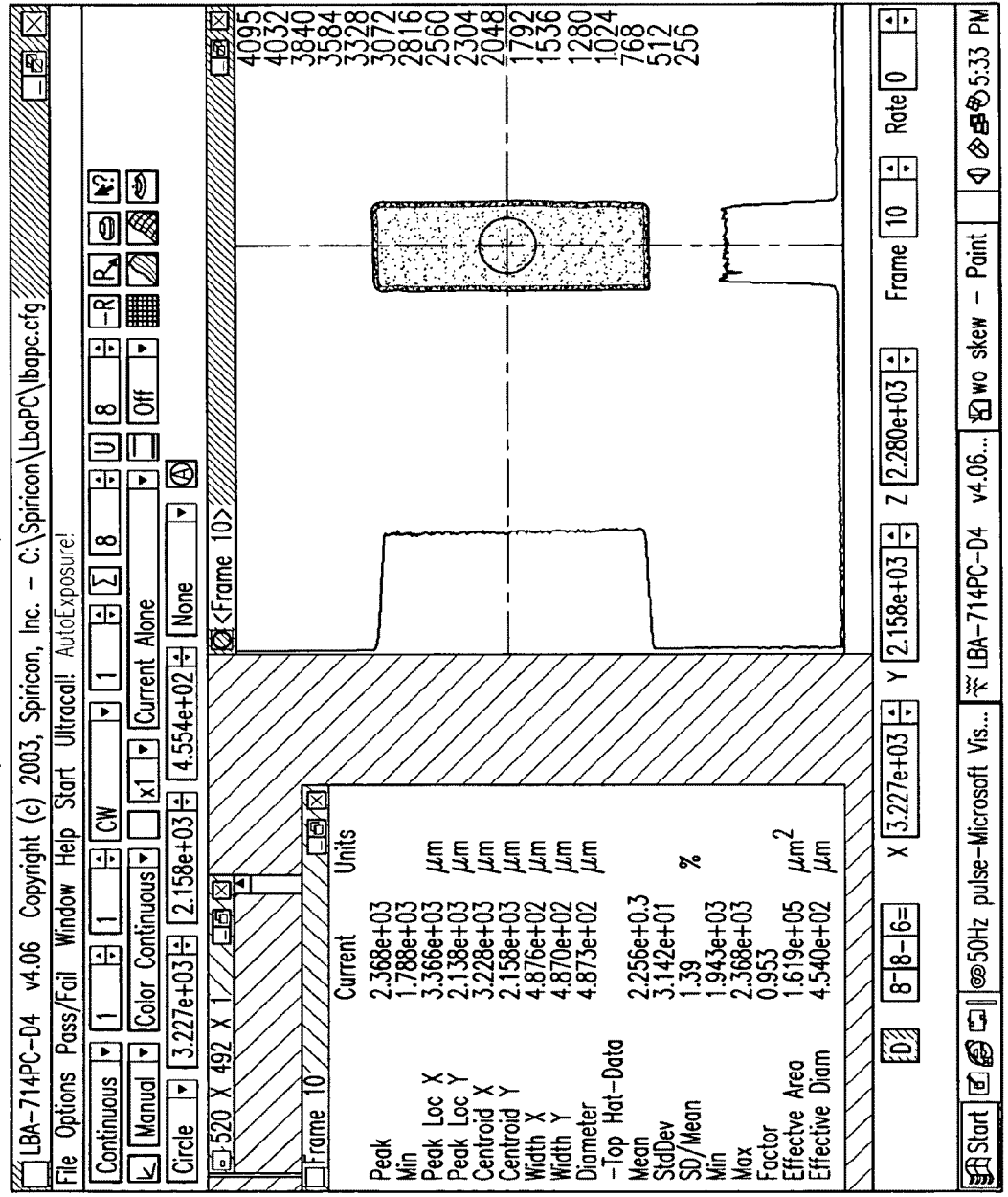
FIG. 4 shows schematically the rectangularly contoured optimized laser beam spot.

As shown in FIG. 4, the homogenized beam spot may be rectangularly contoured. The profile of the full beam emerging from the laser without any compensation has an almost perfect raw beam profile (shown in FIG. 3A) which may be further conditioned with the shaper such as a fiber or light pipe to form a perfectly annular cross-section of the laser beam shown in FIG. 3B. The spatial selectivity, beam homogenization, and energy stable delivery ensures that fewer laser shots will be necessary compared to prior art methods. The number of shots required for annealing the amorphous silicon may be in the range of 1-3 shots.

An aperture may be disposed after the homogenizing optics and/or the glass rod to further contour the beam into any shape. Focusing optics 46 or the galvanometer scan system 44 focuses the beam onto particular areas 30 of the amorphous silicon film 22 for selective crystallization of the amorphous silicon to produce poly-crystallized localized areas 30.

It is contemplated in the present technique, to use either single or multiple beam arrangements. For instance, with a single laser beam delivered to the work surface, the beam cross-section may be shaped circularly, rectangularly, or in any desired shape or contour as dictated by the particular usage.

The single beam is delivered to the work surface in order to crystallize a region 30 within a single pixel. Alternatively, the single beam may be shaped to bisect a plurality of pixels in order to crystallize a stripe of material as shown in FIG. 2B. In this embodiment, the rectangularly shaped beam may be dimensioned with its height smaller than the pixel height and with the width expanding over two or more pixels. In this arrangement, the motion of the beam relative to the substrate may be fulfilled with a three axis stage 12 to control lateral, longitudinal and vertical motion. Under the control of the processor unit 18, the laser is actuated as the desired crystallization areas move through the beam focus.

In the embodiment, shown in FIG. 2C, the laser beam 38 generated by the copper vapor laser 14, is focused on a bundled optical fiber part 49, and is splitted into a plurality of beams ("beamlets") in a plurality of light pipes (fibers) 50 for delivery to pixel locations. In this arrangement, the laser radiation impinges on a selected area 30 within a plurality of pixels simultaneously. The plurality of beams attained with a plurality of light pipes (or optical fibers) 50 with the ends arranged in a predetermined array 52 may be delivered simultaneously to at least a portion of the entire array of the areas 30.

As shown in FIGS. 2C-2D, the plurality of beams or "beamlets" are created by light pipes, or optical fibers 50, which are optically connected to the output of the laser 14. The predetermined array 52 of the laser beamlet spots exiting from the fiber bundle is irradiated on the surface of the amorphous silicon film. The generated laser radiation travels along multiple optical fibers in the fiber bundle 51 and is delivered to the amorphous silicon film simultaneously. In this manner, multiple "beamlets" are used for simultaneous radiation of a plurality of localized areas to be crystallized. The fiber bundle 51 helps to further homogenize the incident laser beam.

Alternatively, the plurality of beamlets may also be produced by directing the laser beam generated by the laser through a holographic optical element (not shown). The two axis galvanometer unit 44 may steer the beam array 52 as a whole relative to the substrate from one predetermined position to another to crystallize the entire amorphous silicon film in a very efficient manner.

As can be seen, with any shape of the laser beam spot and with any arrangement, e.g., a single beam or a plurality of beams, or with the beam spot shaped to create crystallized stripes across several pixels, only the localized areas where the TFTs are to be formed are crystallized. The areas of the amorphous silicon film within pixels not requiring poly-Si are left in their amorphous state.

The fast scanning galvanometer unit 44 irradiates a plurality of predetermined areas 30 on the amorphous silicon film 22 with high precision. It is preferred that the surface of the substrate, as well as amorphous silicon film, is generally a planar surface with the flatness tolerance not exceeding about ±30% of the Rayleigh range of the focused laser beam.

In order to irradiate separate localized areas on the surface of the amorphous silicon film, the processor unit 18 processes the topology data 56 concerning circuitry design such as the position of TFTs to be formed, as well as the shape and size thereof. In accordance with the topology data 56, the processor unit controls the relative disposition between the laser beam 34 and the stage 12 on which the substrate 20 is mounted and actuates the generation of the laser radiation when the laser beam spot 32 is in alignment with the needed localized area(s) 30. It is important that the processor unit 18 controls the alignment and overlapping of the laser exposure pattern with other patterns associated with preceding or subsequent technological processes used for fabrication of the semiconductor device in question, thus avoiding unwanted interference between the microstructures created at different stages of the technological process.

The processor 18 applies a specific scanning schedule for each pattern of radiation, e.g. a single beam or multiple "beamlets," different laser spot shapes, irradiation of a single localized area at predetermined times or several at once.

Referring again to FIGS. 2A-2C, the process starts with forming an amorphous silicon film 22 on a planar surface of the substrate 20 by any technique known in the art such as sputtering, thermal evaporation, and other silicon layer deposition techniques known in the industry. The processor unit 18 controls the relative disposition between the laser beam 34 and the substrate 20 and actuates the copper vapor laser 14 at predetermined time instances in coordination with the identified array of localized area 30 to generate the pulse laser radiation in visible spectrum. The amorphous silicon film 22 is subjected to the radiation laser beam(s) in a predetermined sequential order substantially exclusively at the localized area 30 on the amorphous silicon film 22 to convert the amorphous silicon into polycrystalline silicon only in the areas 30 where the Thin Film Transistors are to be formed.

Depending on the arrangement, such as whether it is a single laser beam or multiple beamlets, as well as on the shape of the laser beam spot, the processor unit scans the laser beam from one localized area 30 to another as shown in FIG. 2A. Alternatively, as shown in FIG. 2B, when the laser beam spot is shaped as a rectangular with the length expanding over two or several pixels, the processor unit scans the laser beam over the surface of the amorphous silicon layer to create in one shot, a polycrystallized stripe extending through two or more of the pixels. In this arrangement, the entire array of the areas to be polycrystallized on the surface of the amorphous silicon layer can be created in a lesser number of steps since each shot of the laser crystallizes the α-Si in several pixels.

Alternatively, when a plurality of beamlets are simultaneously delivered to an area of the amorphous silicon film covering an array of the localized areas for crystallization, even a smaller number of steps is to be performed to cover the entire surface of the substrate, as shown in FIG. 2C.

Figure 5:
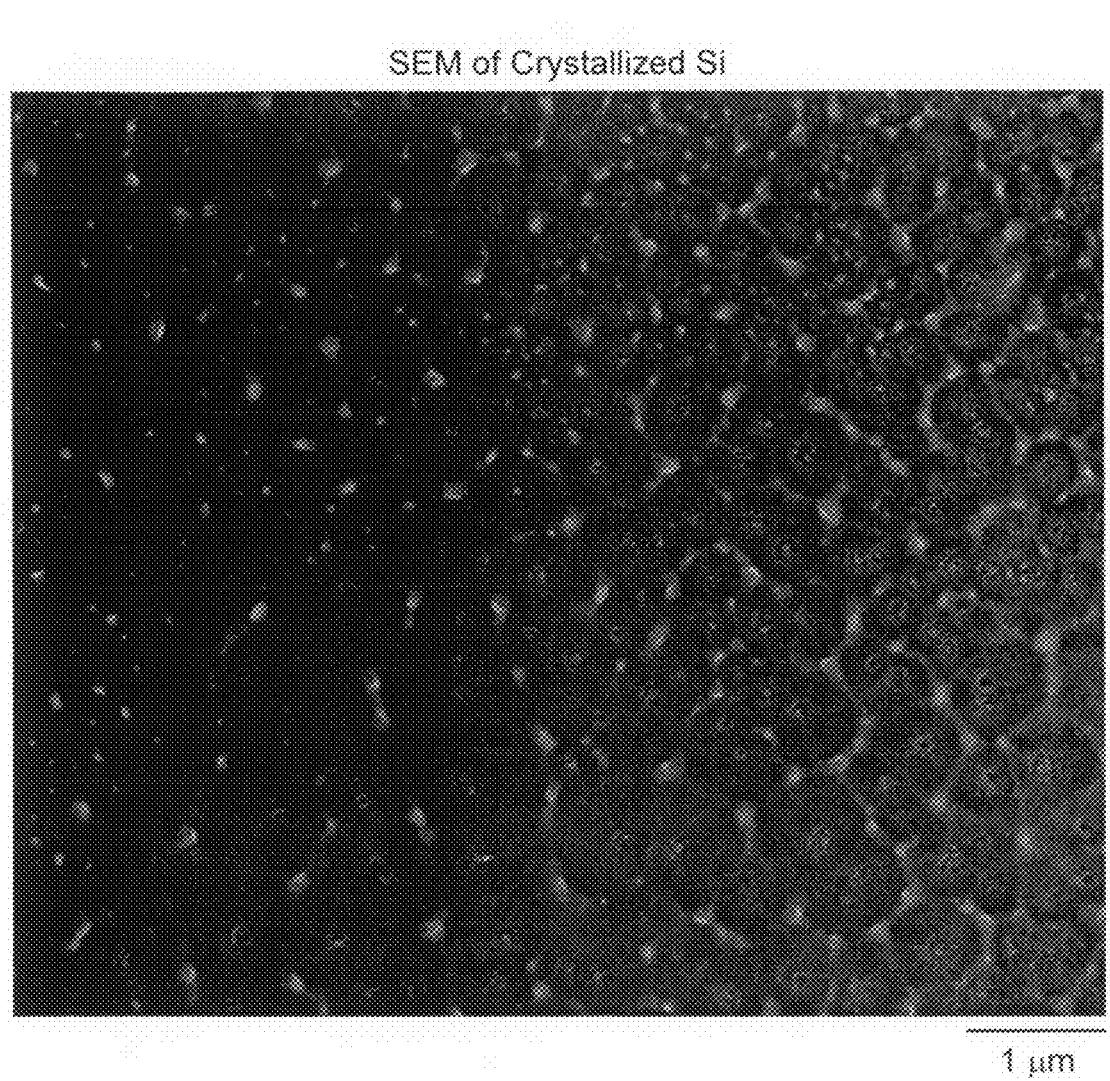
FIG. 5 illustrates the SEM of the selectively crystallized silicon film.
Figure 6:
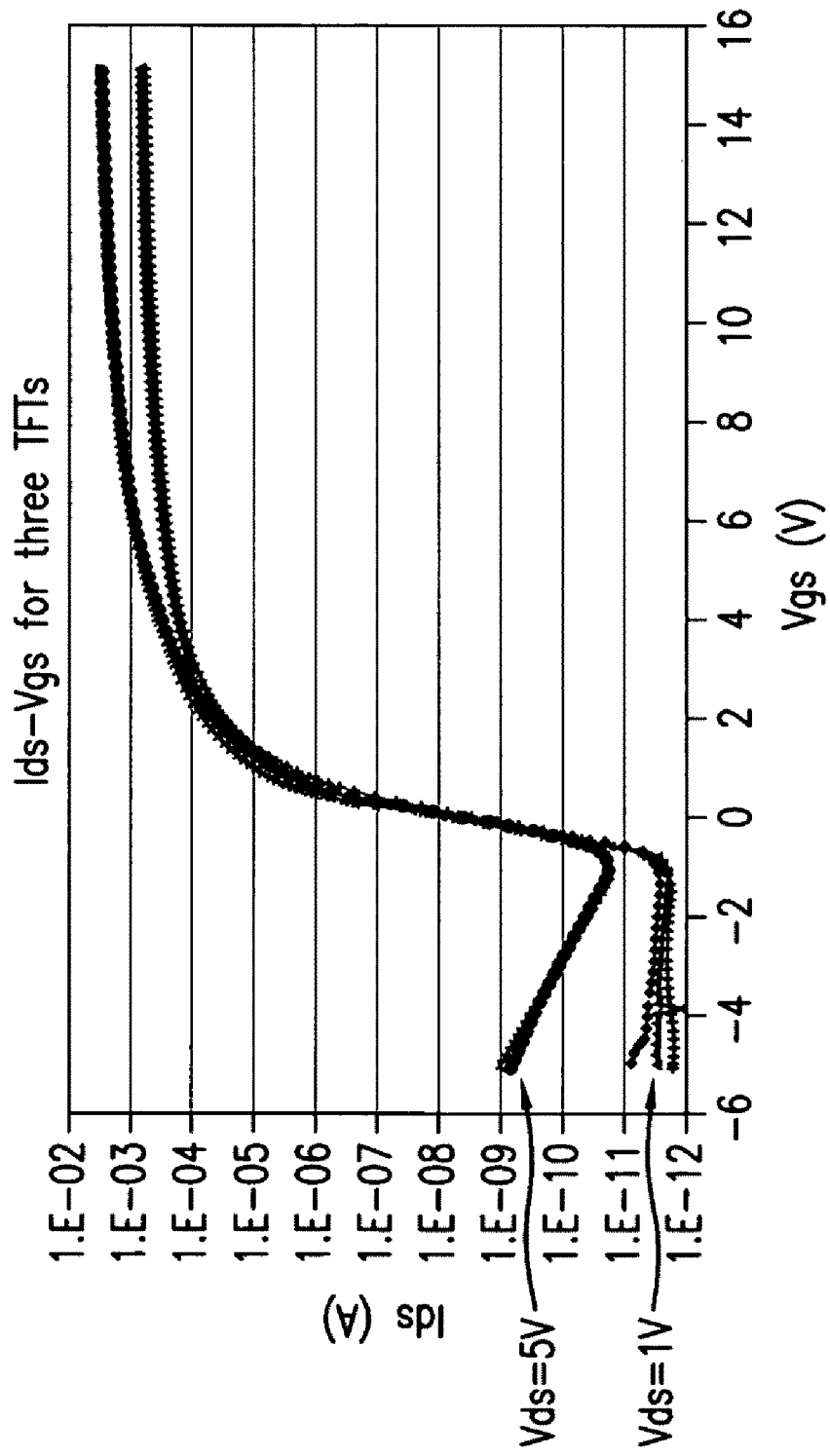
FIG. 6 is a diagram representing Ids vs. Vgs for the TFTs fabricated in the polysilicon film created by the method of the present invention.
Figure 7:
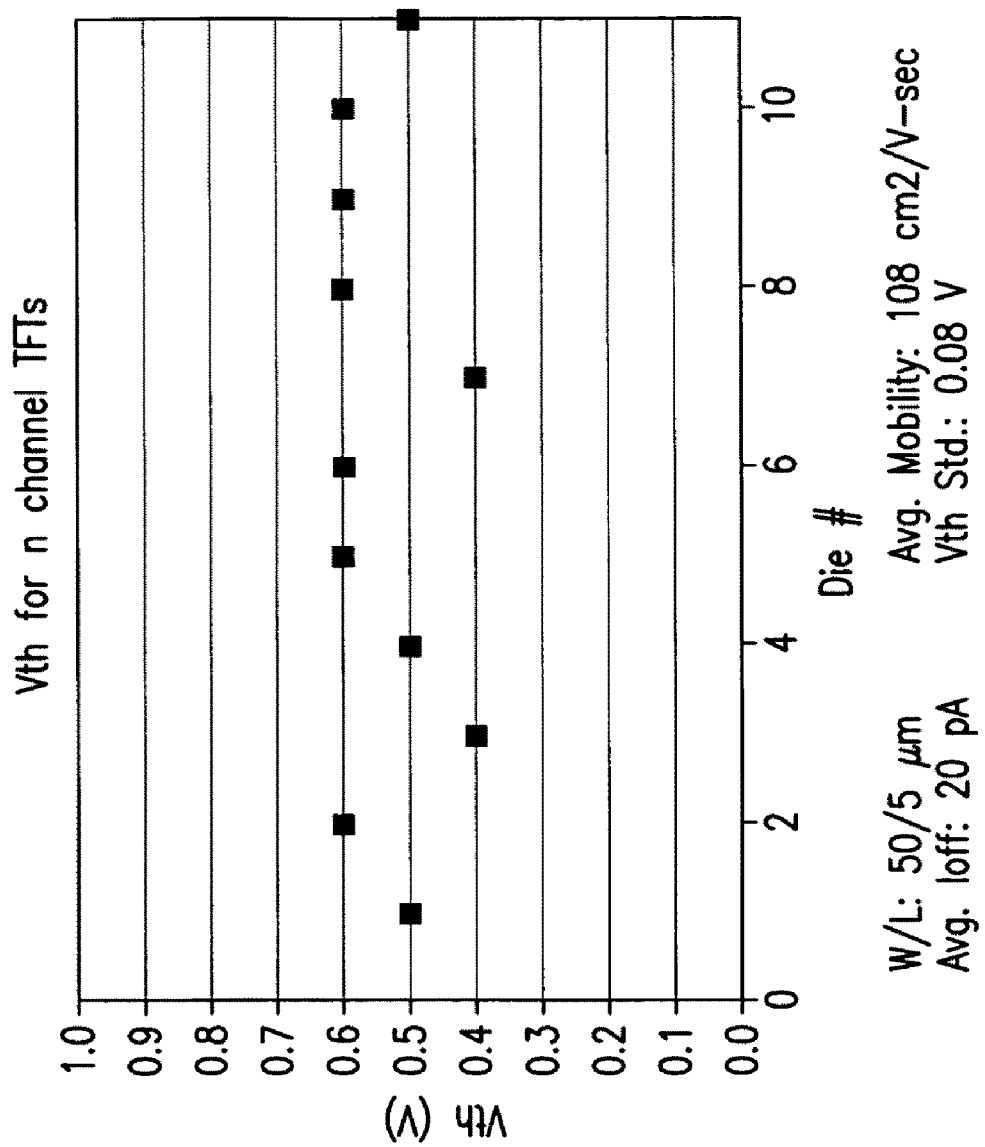
FIG. 7 is a diagram representing Vth for n channel TFTs formed in the polysilicon created in the present system.

In experimentation conducted, a substrate with the amorphous silicon film covered thereon was exposed to the selective crystallization process of the present invention to form localized polycrystalline areas which were studied with a scanning electron microscope (SEM) to image the workpiece surface by scanning it with high energy beam of electrons in a specific scan pattern. FIG. 5 shows the image of the resulting structure with selected polycrystallized areas separated by amorphous silicon. The polycrystallized areas were used for fabricating Thin Film Transistors, and the Ids vs. Vgs diagram was obtained which is shown in FIG. 6 for the LTPS TFT fabricated using the laser annealed polysilicon film. Calculated for Vgs=5V, the mobility is $48^{cm2}/_{V \cdot sec}$, Vth=1.3V, and S=0.55V/dec. These transistors did not receive complete passivation. Vth was measured for n channel TFTs. The diagram is shown in FIG. 7. For the studied TFTs, W/L=50/5 um, average Ioff=20 pA, average mobility is $108^{cm2}/_{V \cdot sec}$, and Vth STD=0.08V.

Table 1 represents Vth data for the TFTs formed on the polycrystallized areas in accordance with the present method.

TABLE 1

All Die Within Region 4
W = 50

| L = 5 | Id, max | Id, min | OOR | Vt | mu | S |
|---|---|---|---|---|---|---|
| Die 1 | 3.51E−03 | 1.58E−11 | 2.23E+08 | 0.5 | 121.83 | 0.197 |
| Die 2 | 3.43E−03 | 2.22E−11 | 1.54E+08 | 0.6 | 123.68 | 0.199 |
| Die 3 | 3.00E−03 | 1.47E−11 | 2.05E+08 | 0.4 | 106.49 | 0.183 |
| Die 4 | 3.34E−03 | 1.89E−11 | 1.77E+08 | 0.5 | 113.23 | 0.211 |
| Die 5 | 3.16E−03 | 3.96E−11 | 7.99E+07 | 0.6 | 108.42 | 0.212 |
| Die 6 | 2.73E−03 | 1.82E−11 | 1.50E+08 | 0.6 | 92.05 | 0.190 |
| Die 7 | 3.41E−03 | 1.65E−11 | 2.07E+08 | 0.4 | 116.35 | 0.175 |
| Die 8 | 2.88E−03 | 1.15E−11 | 2.51E+08 | 0.6 | 92.98 | 0.179 |
| Die 9 | 2.87E−03 | 1.86E−11 | 1.54E+08 | 0.6 | 96.38 | 0.194 |
| Die 10 | 3.01E−03 | 2.49E−11 | 1.21E+08 | 0.6 | 100.12 | 0.204 |
| Die 11 | 3.37E−03 | 2.04E−11 | 1.66E+08 | 0.5 | 116.36 | 0.196 |
| Min | 2.73E−03 | 1.15E−11 | 7.99E+07 | 0.4 | 92.0 | 0.175 |
| Max | 3.43E−03 | 3.96E−11 | 2.51E+08 | 0.6 | 123.7 | 0.212 |
| Average | 3.2E−03 | 2.0E−11 | 1.7E+08 | 0.5 | 108.0 | 0.195 |
| Stand. Dev. | 2.70E−04 | 7.41E−12 | 4.83E+07 | 0.08 | 11.33 | 0.012 |
| Stand. Dev./Average | 0.086 | 0.368 | 0.282 | 0.151 | 0.105 | 0.063 |

The spatially selective crystallization process using the radiation of the copper vapor laser of the present invention provides a time and cost effective production of polycrystalline areas with the quality sufficient for fabrication of the TFT array with high uniformity of the annealing process and repeatability which may result in creation of high quality LCDs and other Flat Panel Displays. The spatially selective crystallization of the present invention may greatly reduce the needed amount of the laser energy and permits to produce polycrystalline silicon in high volumes. With spatially selective grain engineering, the laser energy is delivered selectively to the regions within each pixel where the TFTs are to be fabricated. The implementation of a highly stable energy delivery system allows grain engineering within each spatially selected area. This reduces the required shots per pixel from 20 (in the known techniques) to 1-3. Only fraction of the substrate is crystallized so that smaller amount of energy is needed for manufacturing of semiconductor devices.

The description above is intended to illustrate possible implementations of the present invention and is not restrictive. Many variations, modifications and alternatives will become apparent to the skilled artisan upon review of the disclosure. For example, method steps equivalent to those shown and described may be substituted therefore, elements and methods individually described may be combined, and methodologies described as discrete may be distributed across many algorithm techniques. The scope of the invention should therefore be determined not with reference to the particular description above, but with reference to the appended claims, along with their full range of equivalence.

What is being claimed is:

1. A system for fabricating a semiconductor device including arrays of Thin Film Transistors (TFTs), the system comprising:
   a substrate;
   a continuous amorphous silicon (α-Si) film formed on a surface of said substrate;
   a positioning stage, said substrate with said a α-Si film formed thereon being secured to said positioning stage;
   a copper vapor laser generating pulsed visible laser radiation;
   data concerning a topology of said semiconductor device;
   a processor unit operatively coupled to said positioning stage and said copper vapor laser, said processing unit controlling relative disposition between said substrate and said pulsed visible laser radiation to sequentially direct said pulsed visible laser radiation to positions of localized areas on said α-Si film corresponding to locations of said TFTs, and intermittently actuate said copper vapor laser at selected time instances in correspondence with said disposition between said substrate and said pulsed visible laser radiation to irradiate only said positions of localized areas on said α-Si film corresponding to said locations of said TFTs; and an optical unit coupled to said copper vapor laser to condition said pulsed visible laser radiation into an homogenized and focused pulsed visible laser beam delivered to said localized areas and thereby crystallize said α-Si film sufficiently exclusively at said localized areas thereof.

2. The system of claim 1, wherein said copper vapor laser is a rapid pulsed laser with the pulse repetition frequency in the range of up to 10 kHz, and pulse duration not exceeding 200 nanoseconds, operating at wavelengths in the range of 500-600 nm, and having laser beam quality factor $M^2>15$.

3. The system of claim 1, wherein said surface of said substrate is a planar surface with flatness tolerance ranging between −30% and +30% of the Rayleigh range of said focused pulsed visible laser beam.

4. The system of claim 1, wherein said optical unit includes a plurality of light pipes dividing said pulsed visible laser radiation into a plurality of substantially identical laser beams arranged to form a predetermined array of laser beam spots irradiating said surface in common and corresponding to at least a portion of said array of TFTs.

5. The system of claim 1, wherein said homogenized and focused pulsed visible laser beam has a rectangularly contoured laser beam spot with the length thereof expanding over at least two neighboring of said localized areas.

* * * * *